US006778847B2

(12) United States Patent
Wu et al.

(10) Patent No.: US 6,778,847 B2
(45) Date of Patent: Aug. 17, 2004

(54) SYSTEM AND METHOD FOR MRI TAGGING USING SPATIAL MODULATION OF MAGNETIZATION

(75) Inventors: Ed X. Wu, New York, NY (US); Haiying Tang, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 34 days.

(21) Appl. No.: 10/143,316

(22) Filed: May 3, 2002

(65) Prior Publication Data

US 2003/0206013 A1 Nov. 6, 2003

(51) Int. Cl.[7] .............................................. A61B 5/055
(52) U.S. Cl. ....................................... 600/410; 324/309
(58) Field of Search ................................ 600/407, 410, 600/413; 324/307, 309

(56) References Cited

U.S. PATENT DOCUMENTS

| | | | | |
|---|---|---|---|---|
| 4,777,957 A | * | 10/1988 | Wehrli et al. ............... | 600/413 |
| 4,953,554 A | * | 9/1990 | Zerhouni et al. ........... | 600/410 |
| 5,189,371 A | * | 2/1993 | Conolly et al. ............. | 324/309 |
| 5,512,825 A | | 4/1996 | Atalar et al. | |
| 5,923,770 A | | 7/1999 | O'Donnell et al. | |
| 6,171,241 B1 | | 1/2001 | McVeigh et al. | |
| 6,546,274 B2 | * | 4/2003 | Itagaki et al. ............... | 600/413 |

OTHER PUBLICATIONS

Tsekos et al., (1994) "Myocardial Tagging with B₁ Insensitive Adiabatic DANTE Inversion Sequences", MRM 34: pp. 395–401.

Bolster et al., (1990) "Myocardial Tagging in Polar Coordinates with Use of Striped Tags", Radiology 177: pp. 769–772.

Leon Axel, (1989) "MR Imaging of Motion with Spatial Modulation of Magnetization", Radiology 171: pp. 841–845.

Leon Axel, (1989) "Heart Wall Motion: Improved Method of Spatial Modulation of Magnetization for MR Imaging", Radiology 172: pp. 349–350.

Zerhouni et al., (1988) "Human Heart: Tagging with MR Imaging—A Method for Noninvasive Assessment of Myocardial Motion", Radiology 169: pp. 59–63.

Meckle et al., "Combined Data Acquisition of Multi–Contrast Images", Depts. of Biomedical Engineering and Radiology, Columbia University, New York.

\* cited by examiner

*Primary Examiner*—Shawna Jeannine Shaw
(74) *Attorney, Agent, or Firm*—Baker Botts LLP

(57) ABSTRACT

A method of inducing tag lines in an MRI image is provided which allows adjustment of tag line width and spacing. The method includes determining a desired tag line width and then selecting a parameter of a SINC modulating function, such as main lobe bandwidth, in accordance with the desired tag line width. The method also includes determining a desired tag line separation and selecting a parameter of an RF pulse train based upon the desired tag line separation. A gradient field is applied to the specimen being imaged. The RF pulse train is modulated in accordance with the SINC modulating function and the modulated RF pulse train is applied to the specimen being imaged prior to an image acquisition operation. In one embodiment of the invention, the gradient is activated between pulses of the RF pulse train and is deactivated during the RF pulses.

20 Claims, 8 Drawing Sheets

SYSTEM AND METHOD FOR MRI TAGGING USING SPATIAL MODULATION OF MAGNETIZATION

FIELD OF THE INVENTION

The present invention relates generally to magnetic resonance imaging and more particularly relates to magnetic resonance imaging using spatial modulation of magnetization to establish a frame of reference in the form of tag lines on the resulting image.

BACKGROUND OF THE INVENTION

Magnetic resonance imaging (MRI is a well established tool for medical imaging. In magnetic resonance imaging (MRI), the proton density of physical tissue characteristics is sensed to discriminate between healthy and diseased tissue. In the case of tissue that is in motion, such as the human heart, diseased tissue of the heart can be detected by analysis of wall motion of a heart chamber and wall thickness during the cardiac cycle.

U.S. Pat. No. 4,953,554 describes a system and method for MRI imaging which uses a modulated RF signal to impose reference void lines on the resulting image. The '554 patent recognizes that such non-invasive MRI tagging is useful in establishing a frame of reference in the image data which is important in the analysis of moving bodies, such as the heart. The method described in the '554 patent includes modulating an RF pulse that is applied to the body being imaged prior to acquiring image data. More particularly, the '554 patent discloses modulating an RF carrier pulse in the form (1+2 cos $\omega_0$t) with a function in the form of (sin(t)/t) just prior to conducting imaging acquisition. However, this form of modulated signal results in a non-uniform gradient which can result in aliasing.

There have been a number of improvements developed to spatially modulate the magnetization field, thereby providing a reference frame on the image in a non-invasive manner. Most notable among these improvements are the SPAMM and DANTE tagging techniques.

The SPAMM method, which is described for example in the article "A cine-SPAMM Sequence for NMR Imaging of Pulsatile Cerbrospinal Fluid Flow," by Wayte et. al., Phys. Med. Biol., pp. 455–463, 1993, produces a sinusoidal modulation of saturated magnetization. An improvement to SPAMM, know as high-order SPAMM, improves the resulting modulation profile by employing binomial modulation of the RF pulse train. While these systems have proven effective in a number of applications, neither SPAMM nor high order SPAMM provide the user with the flexibility to alter the ratio of the tag width (width of the void line) to tag separation. Thus, the user is limited in the form of the resulting image tagging that can be achieved.

DANTE tagging employs a delta function to effect tagging. By effecting spatial modulation with a series of narrow RF pulses of uniform amplitude, the resulting saturation tags exhibit a SINC profile. The DANTE system is further described, for example, in the article entitled "Myocardial Tagging with B1 insensitive Adiabatic DANTE Inversion Sequences" by Tesekos, et al., 1994, pp 395–401, which is hereby incorporated by reference in its entirety.

SUMMARY OF THE INVENTION

It is an object of the present invention to provide MRI tagging using a modulated RF pulse train which yields a rectangular profile of saturated magnetization.

It is a further object of the present invention to provide a method of MRI tagging which provides flexibility in selecting the resulting tag width and tag separation.

In accordance with the present invention, a first method for inducing tag lines in an MRI image begins with the steps of determining a desired tag line width and determining a desired tag line separation. One or more parameters of a SINC modulating function are then selected in accordance with the desired tag line width. One or more parameters of an RF pulse train based are selected based upon the desired tag line separation. A gradient field is applied to the specimen being imaged. The RF pulse train is modulated in accordance with the SINC modulating function and the modulated RF pulse train is applied to the specimen being imaged prior to an image acquisition operation.

Preferably, the SINC modulating function is defined at least in part by the bandwidth of a main lobe, and by altering the bandwidth of the main lobe the width of the resulting tag lines is altered accordingly. It is also preferable for the RF pulses of the RF pulse train to be separated by a delay time between pulses which can be altered to determine the resulting tag line separation. Because these parameters of the modulating waveform and RF pulse train can be varied substantially independently of each other, a great deal of flexibility is provided.

Each pulse in the RF pulse train has a flip angle associated with a pulse amplitude and pulse duration. Preferably, the pulse amplitude and pulse duration can be varied, in an inverse relationship, to maintain the flip angle associated with the pulse while optimizing or reducing the peak power requirement. In one embodiment, the pulses in the RF pulse train have a common amplitude and the duty cycle of the pulses is modulated to deliver the appropriate flip angle per pulse in accordance with the SINC modulating function.

In the methods set forth above, the step of applying the gradient preferably occurs in a pulsed manner such that the gradient is active only between pulses of the RF pulse train.

BRIEF DESCRIPTION OF THE DRAWING

Further objects, features and advantages of the invention will become apparent from the following detailed description taken in conjunction with the accompanying figures showing illustrative embodiments of the invention, in which.

Figure 1:
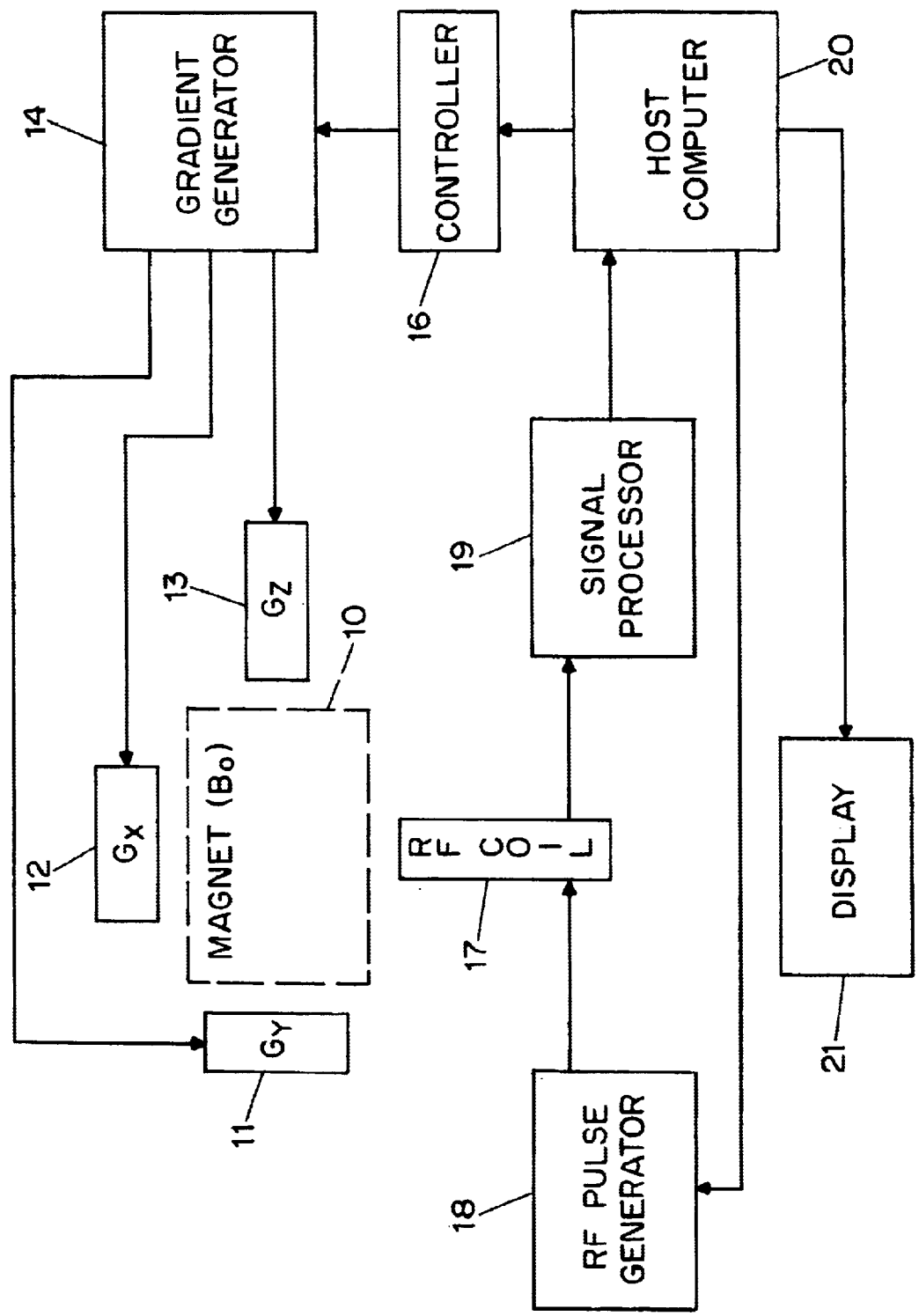
FIG. 1 is a simplified block diagram of an MRI apparatus.

Throughout the figures, the same reference numerals and characters, unless otherwise stated, are used to denote like features, elements, components or portions of the illustrated embodiments. Moreover, while the subject invention will now be described in detail with reference to the figures, it is done so in connection with the illustrative embodiments. It is intended that changes and modifications can be made to the described embodiments without departing from the true scope and spirit of the subject invention as defined by the appended claims.

DETAILED DESCRIPTION OF PREFERRED EMBODIMENTS

The method of the present invention may be used with standard MRI apparatus if such apparatus has control capabilities where parameters of the radio frequency (RF) pulse train and gradient may be easily varied. Referring to FIG. 1, a simplified block diagram of an MRI device is illustrated. The MRI device includes a main magnet 10 which provides a magnetic field $B_0$ that generates a steady magnetic field realizing a polarization of the nuclei of the protons of the specimen or subject for which an image is desired. Within magnet 10 there is a cavity or space in which the specimen or human to be examined is placed.

The apparatus also includes a gradient system for producing spatial linear field gradients. These gradient fields are generally established by a set of three orthogonal direct current coils 11, 12 and 13, which generate the three principal gradients $G_y$, $G_x$, and $G_z$. These coils are driven by gradient generator 14, which in turn is controlled by a controller 16 which communicates with the host computer 20. Typical gradients used in MRI image processing are the well known slice select, readout, and phase encoding gradients.

Typical MRI systems also generally include a radio frequency (RF) coil 17 which generates a radio frequency field in the specimen being analyzed and senses a free induction decay or spin echo signal which is generated after termination of the radio frequency pulse. RF pulse unit 18 excites RF coil 17.

The signal processor 19 receives the small microvoltage level spin echo signals which are reconstructed by computer 20 to form an image. The image is digitized and stored in the memory section of computer 20 for later display on display unit 21.

Protons with their magnetic axis aligned in the transverse plane are termed "saturated," as will be discussed below. If the imaging step is conducted with a magnetic axis of a proton already in the transverse plane, then due to the subsequent gradient crushing or dephasing, the magnetic axes will be aligned orthogonally to the slice plane (along the Z axis) which produces no signal, thereby resulting in a perceptible void in the image.

Figure 2A:
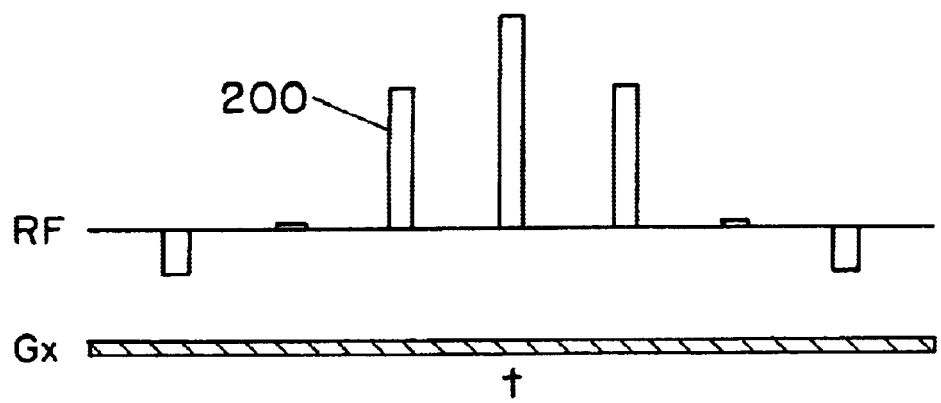
FIG. 2A is a timing diagram illustrating an RF magnetization pulse train in accordance with the present invention in the presence of a constant magnetic gradient Gx.
Figure 2B:
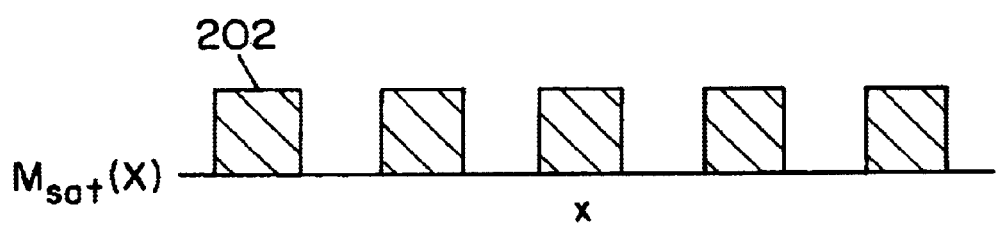
FIG. 2B is a graph of the spatial modulation of magnetization, having a tag width to separation ratio of 1:2, which results from the RF pulse train of FIG. 2A.

Referring to FIGS. 2A and 2B, the present invention uses a SINC function to modulate the RF pulses 200 from generator 18 in a manner which yields relatively uniform rectangular magnetization profile tags 202. As will be set forth below, the present invention allows for control of both the width of the tags and the separation of the tags.

A first order approximation of the presaturated magnetization profile produced by an RF pulse train in the presence of a constant gradient $G_x$ is the Fourier transform of the RF pulse train waveform. Assume the width of individual RF pulses is infinitesimal, the SINC modulated RF pulse train can be written as:

$$rf(t) = sinc\left(\frac{\pi t}{\Delta t_1}\right) \times comb(t, \Delta t_2) \quad [1]$$

where $$sinc\left(\frac{\pi t}{\Delta t_1}\right)$$

is the SINC function with the first zero crossing at $\Delta t_1$ and $comb(t, \Delta t_2)$ is the comb function of spacing $\Delta t_2$. Thus the spatial modulation of magnetization can be approximated as:

$$M_{sat}(x) = rect(\gamma G_x \Delta t_1 x) \otimes comb\left(x, \frac{1}{\gamma G_x \Delta t_2}\right) \quad [2]$$

which provides rectangular tags of width $1/(\gamma G_x \Delta t_1)$ and separation $1/(\gamma G_x \Delta t_2)$. As is evident from this equation, both the tag width and separation are influenced by the gradient $G_x$. Thus, in addition to influencing the tag line properties with the characteristics of the SINC function and comb function, the magnitude of the gradient can also be used to define these properties.

FIGS. 2A, 2B, 3A, 3B and 4A, 4B illustrate examples of SINC modulated RF pulse trains and corresponding saturated magnetization profiles of varying tag width to separation ratios, i.e., 1:2, 1:4 and 1:8, respectively. The ratio of tag width to tag separation is controlled by controlling the ratio of $\Delta t_2$ to $\Delta t_1$. This approach can also be extended to 2D and 3D tagging without causing signal loss in untagged areas.

While expressed above as an ideal comb function, In practical implementations, the width of individual RF pulses is finite. This finite width may cause undesirable shading across the image in the presence of the constant gradient $G_x$.

Assuming the duration of individual rectangular RF pulses is $\Delta t_3$, the SINC modulated RF pulse train can be expressed as:

$$rf(t) = \left(sinc\left(\frac{\pi t}{\Delta t_1}\right) \times comb(t, \Delta t_2)\right) \otimes rect\left(\frac{t}{\Delta t_3}\right) \quad [3]$$

and the saturated magnetization profile then approximated by:

$$M_{sat}(x) = \left(rect(\gamma G_x \Delta t_1 x) \otimes comb\left(x, \frac{1}{\gamma G_x \Delta t_2}\right)\right) \times sinc(\pi x \gamma G_x \Delta t_3). \quad [4]$$

Thus the shading is characterized by a SINC modulation, $sinc(\pi x \gamma G_x \Delta t_3)$. This shading can be visible and detrimental when tagging a large field of view with very small tag separation. Reducing the duration of individual RF pulses, $\Delta t_3$, can overcome this problem. However, doing so may impose high RF peak power requirements in some applications, such as human cardiac studies.

Figure 6A:
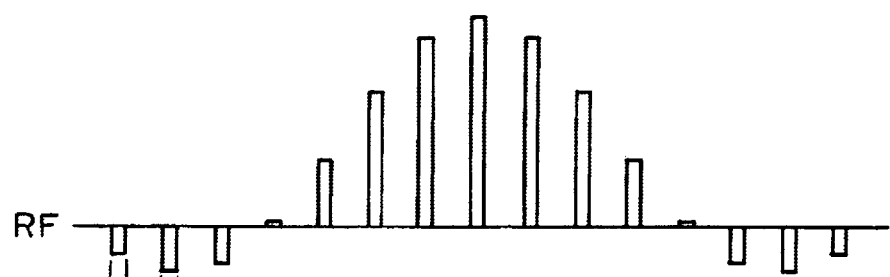
FIGS. 6A and 6B are graphs illustrating the timing relationship between the SINC modulated RF pulses and a pulsed gradient signal wherein the gradient pulses are active between the RF pulses.
Figure 6B:

To address the problem of shading in a manner which does not put undo limitations on the peak power requirements of the RF generator, it has been discovered that the constant gradient $G_x$ can be replaced by gradient segments between RF pulses without affecting the saturation profile as long as the gradient segment integral (i.e., the phase accumulation) between adjacent RF pulses is preserved. FIGS. 6A and 6B illustrate, by way of timing diagrams, a first example where gradient segments are active only between the RF pulses of the SINC modulated RF waveform.

Figure 5:
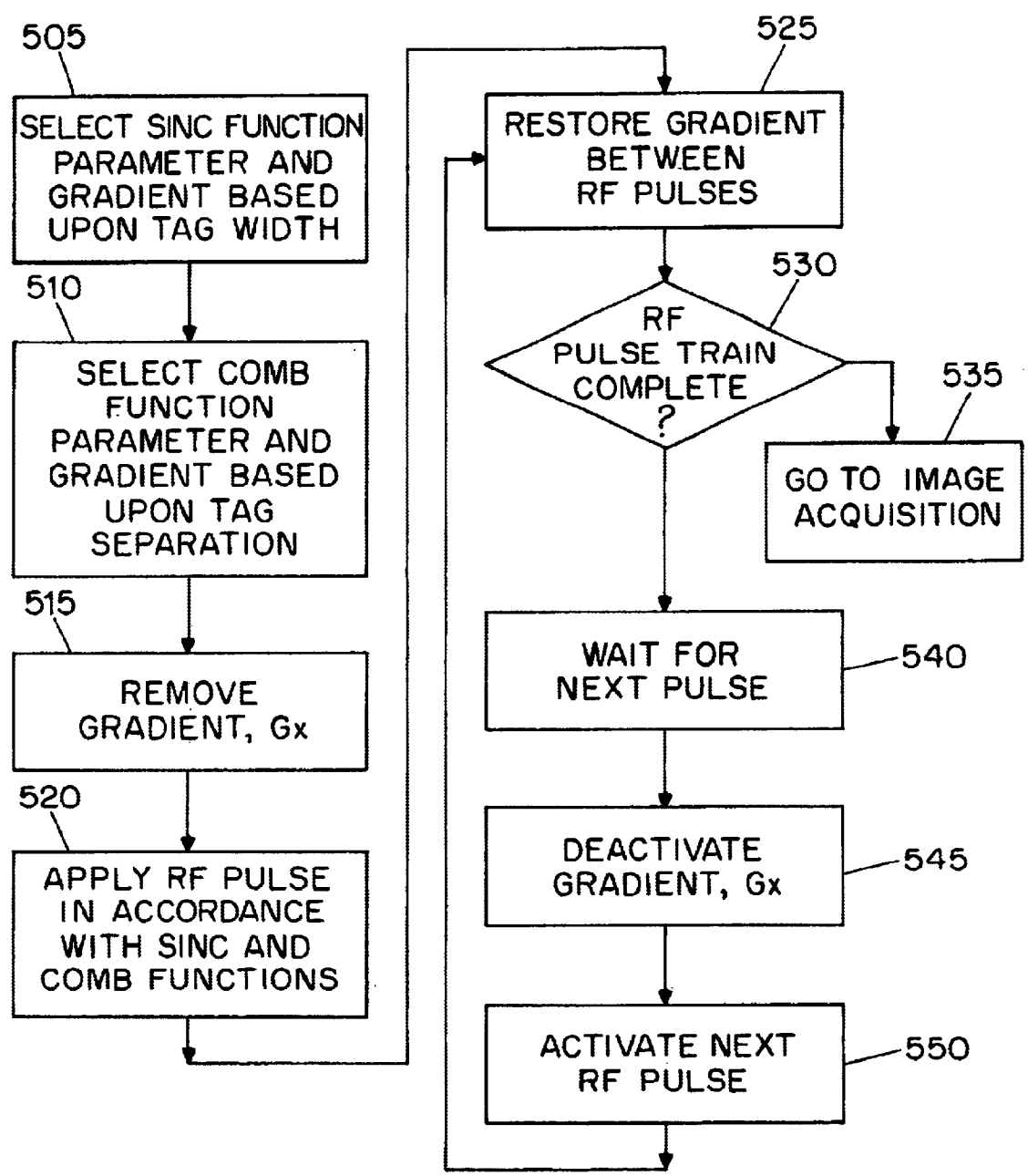
FIG. 5 is a flow chart illustrating a method of applying a SINC modulated RF pulse train to establish tag lines in a specimen being imaged in accordance with the present invention.

FIG. 5 is a simplified flowchart describing the generation of the waveforms depicted in the timing diagrams of FIGS. 6A and 6B. As described above, the present invention provides for the selection of both tag width and separation by controlling parameters of the gradient, the SINC modulation function and the RF pulses of the comb function being modulated. In step 505, the desired tag width is set by adjusting the lobe width of the SINC function ($\Delta t_1$). As is evident in equation 2, set forth above, both tag width and separation are also simultaneously affected by the gradient, $G_x$. The tag separation can be adjusted by altering gradient and the time between RF pulses in the comb function ($\Delta t_2$), as illustrated in step 510. While the gradient alters both the tag width and separation, it effects each of these parameters simultaneously. The tag width and separation are altered independently of each other by varying the SINC function and comb function as described above.

Prior to activation of the first RF pulse, the gradient, $G_x$, is turned off (step 515) and the RF pulse is then applied (step 520). At the end of the RF pulse, the gradient Gx is again turned on (step 525). This process is completed for each pulse in the SINC modulated RF pulse train. If there are additional pulses in the pulse train to be applied (step 530), the process idles with the gradient active until the start time of the next RF pulse (step 540). If there are no more pulses in the pulse train, then the process advances to conventional MRI image acquisition (step 535). The gradient, $G_x$, is then deactivated (step 545) and the next RF pulse, whose amplitude and duration are determined by the SINC and comb function parameters, is applied (step 550). At the end of the pulse, the process returns, in a loop, to step 525.

Figure 7A:
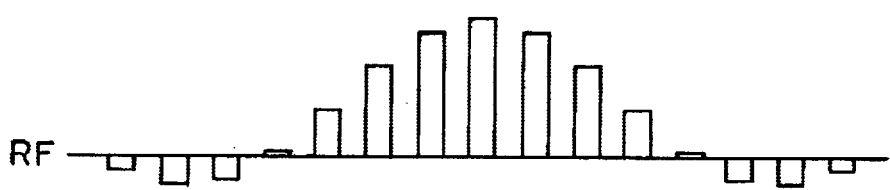
FIGS. 7A and 7B are graphs illustrating the timing relationship between the SINC modulated RF pulses and a pulsed gradient signal in an equivalent relationship to that depicted in FIG. 6, wherein the RF pulses have a longer duty cycle and lower peak amplitude.
Figure 7B:

FIGS. 7A and 7B are timing diagrams which illustrate an equivalent example to that depicted in FIG. 6. As compared to the example in FIG. 6A, in the case of FIG. 7A, the amplitude of the individual RF pulses is reduced, but the duty cycle of such pulses have been extended to preserve the power of each pulse and maintain an equivalent resulting spatial magnetization tag. This alteration permits the use of longer pulse duration to reduce peak power requirement, and allows equalized RF pulse amplitudes to minimize the total pulse train duration, reducing delays to the initialization of imaging after the QRS complex trigger. This modification of the RF pulse could occur, for example, in steps 505 and/or 510 of the method depicted in FIG. 5.

Figure 8A:
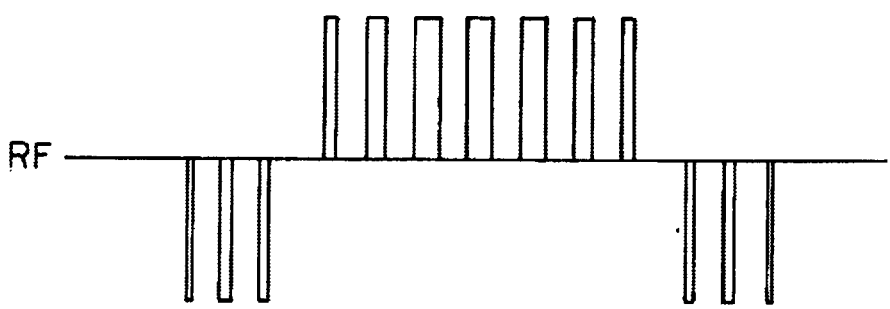
FIGS. 8A and 8B are graphs illustrating the timing relationship between the SINC modulated RF pulses and a pulsed gradient signal in an equivalent relationship to that depicted in FIG. 6, wherein the RF pulses have a constant magnitude but exhibit a varying duty cycle determined by the SINC modulation.
Figure 8B:
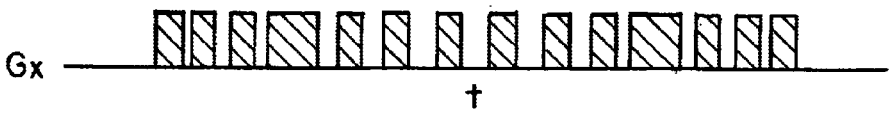

FIGS. 8A and 8B illustrate a further equivalent timing relationship to that illustrated in FIG. 6. In FIG. 8A, the amplitude of each of the RF pulse segments is now constant rather than varying in accordance with the SINC modulation. However, the duty cycle of the RF pulses, which was previously constant, is now varied to provide the SINC modulation of the RF signal. The gradient pulses illustrated in FIG. 8B are now pulse width modulated as well to correspond to the varying duty cycle of the RF signal. Note that SINC modulated RF pulse trains can be further iteratively optimized by simulating the Bloch equation numerically.

The present methods are generally incorporated into conventional MRI apparatus by way of programming the host computer 20 and/or controller 16 in order to generate the desired waveforms from the RF pulse generator 18 and gradient generator 14. The software is generally written in any number of conventional programming languages and can be stored and transported on conventional computer readable media, such as magnetic storage disks (floppy diskettes, hard disks and the like), optical disks (CD-ROMS) and the like.

Experimental Results

The present invention has been implemented using a Bruker AVANCE 400WB spectrometer (Bruker NMR, Inc., Billerica, Mass.) with an 89 mm vertical bore magnet of 9.4 T (Oxford Instruments Ltd., UK) using a 30-mm-i.d. quadrature RF probe and a shielded gradient system up to 100 G/cm. The SINC modulated RF pulse trains in conjunction with a constant gradient illustrated in FIGS. 2A, 2B, 3A, 3B, and 4A, 4B, were implemented for both a phantom and an in vivo animal study. The RF pulse trains were 6 ms long and modulated by a 3-lobe SINC function. The duration of individual RF pulses was 20 $\mu s$, 40 $\mu s$ and 80 $\mu s$ using waveforms illustrated in FIGS. 2A, 3A and 4A, respectively.

The DANTE tagging method, consisting of an RF pulse train of uniform amplitude and constant gradient, was also implemented for comparison. To achieve a tag width to separation ratio equivalent to that in FIG. 2B for comparison (1:4), the number of RF pulses in DANTE pulse train was chosen to be four (4). In all experiments, the RF transmitter attenuation was calibrated for the tagging RF pulse train to produce a 90° flip angle. The tagging sequence was followed by a 1.5 ms crusher gradient.

For the phantom study, a 20 mm tube of water doped with copper sulfate was used. Images were obtained by RF pulse train tagging followed by a 2D gradient echo (GE) encoding with the following sequence parameters: FOV=22 mm, acquisition matrix=256×256, slice thickness=2 mm, TR/TE=300/3 ms, flip angle=30°, number of averages=1. The RF pulse trains in FIGS. 2A, 3A, and 4A were employed to demonstrate various spatial modulation of magnetization.

The in vivo mouse heart study was performed using a normal wild-type adult mouse (C57BL/6,25 g). During the imaging experiment the mouse was anesthetized with isoflurane gas (1.5 vol. % at 2L/min air flow) via a nose cone. The ECG was recorded from the front limbs using subcutaneous silver electrodes. During imaging heart rate was approximately 500 beats per minute. Imaging was performed with an ECG-gated fast 2D GE sequence using TR/TE=110/1.8 ms, FOV=26 mm, acquisition matrix=168× 168, slice thickness=1.5 mm, flip angle=20°, number of averages=8. The total acquisition time was approximately 2.5 min. The tagging waveform in FIG. 2B was employed. There was a 3 ms delay between the end of the tagging sequence and the start of the GE imaging sequence, i.e., slice selective RF excitation. Delay between the QRS complex trigger and the start of the GE sequence was approximately 10 ms, therefore, images were acquired during ventricular systole.

Figure 3A:
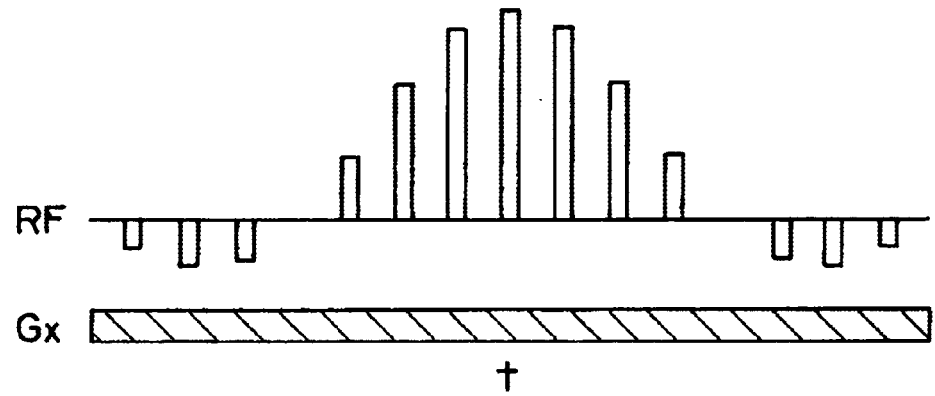
FIG. 3A is a timing diagram illustrating an RF magnetization pulse train in accordance with the present invention in the presence of a constant magnetic gradient Gx.
Figure 3B:
FIG. 3B is a graph of the spatial modulation of magnetization, having a tag width to separation ratio of 1:4, which results from the RF pulse train of FIG. 3A.
Figure 4A:
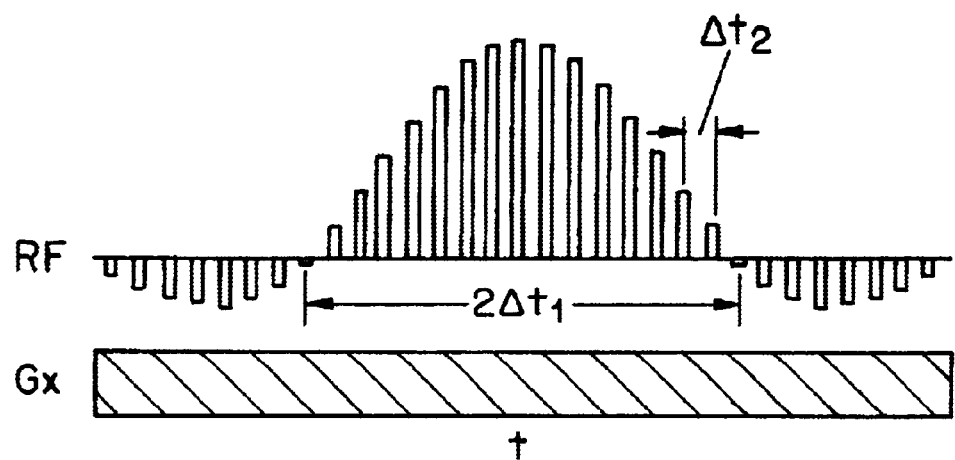
FIG. 4A is a timing diagram illustrating an RF magnetization pulse train in accordance with the present invention in the presence of a constant magnetic gradient Gx.
Figure 4B:
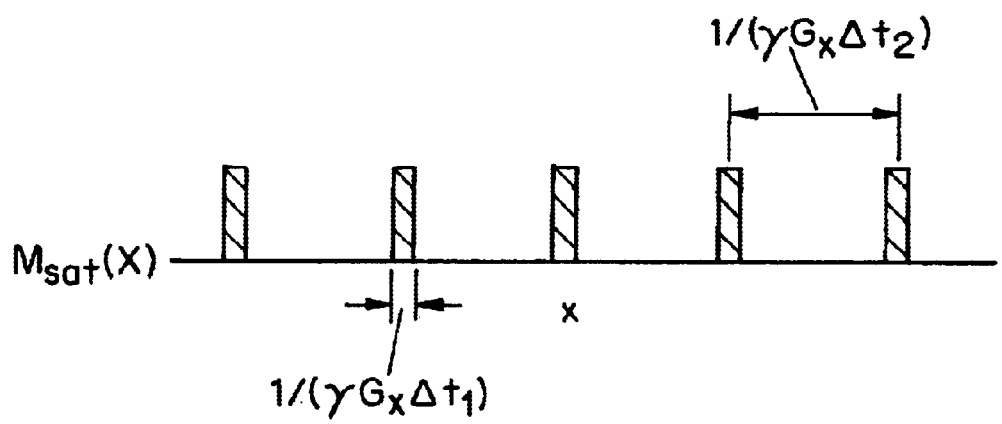
FIG. 4B is a graph of the spatial modulation of magnetization, having a tag width to separation ratio of 1:8, which results from the RF pulse train of FIG. 4A.
Figure 9A:
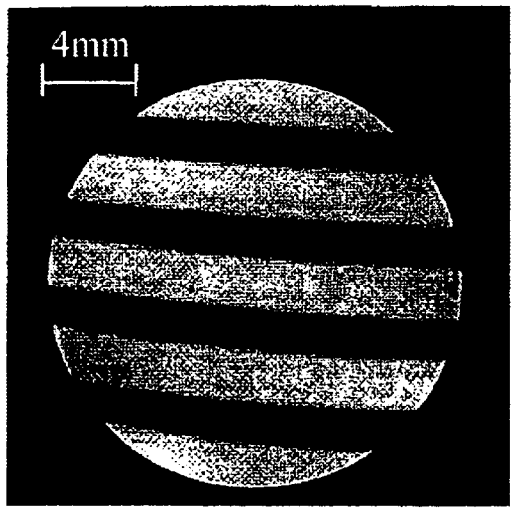
FIGS. 9A, 9B and 9C are examples of images acquired during a phantom study using the waveforms of FIGS. 2A, 3A and 4A, respectively.
Figure 9B:
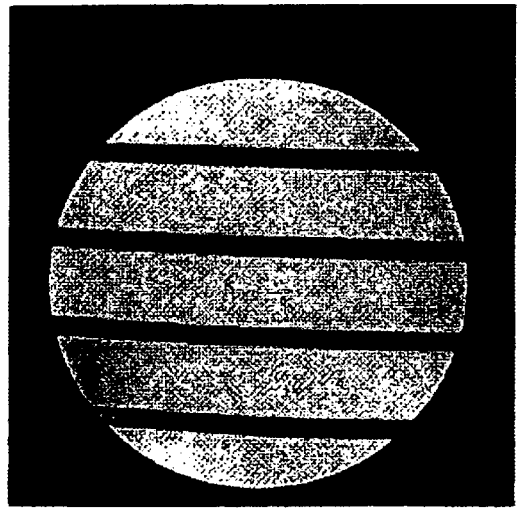
Figure 9C:
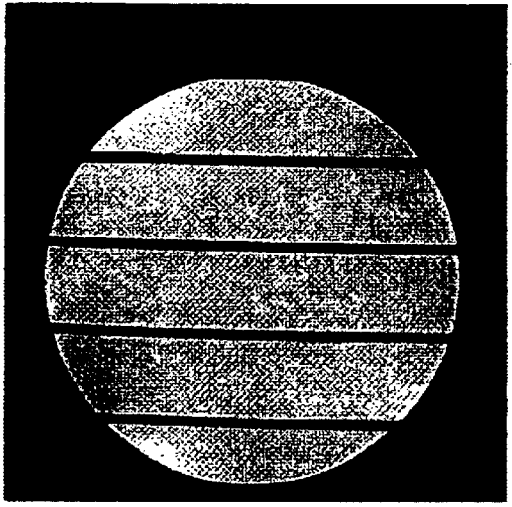
Figure 10:
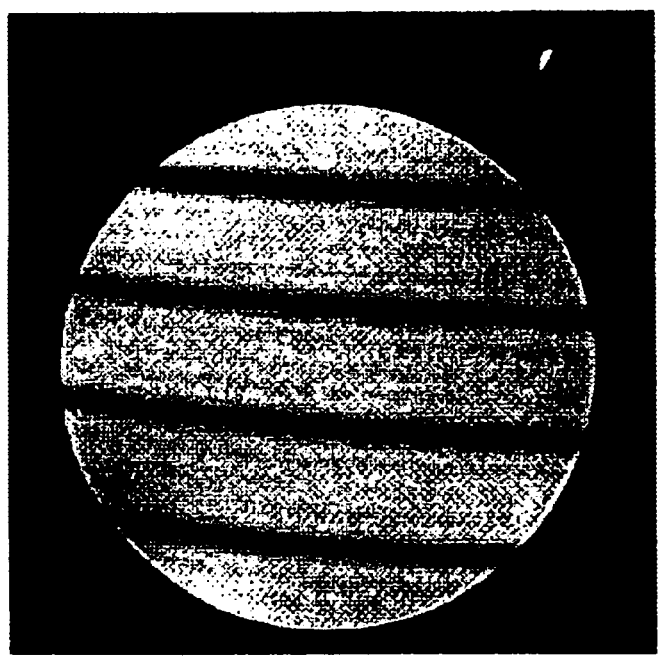
FIG. 10 is an example of an image acquired during a phantom study using the prior art DANTE technique for tagging the image.
Figure 11:
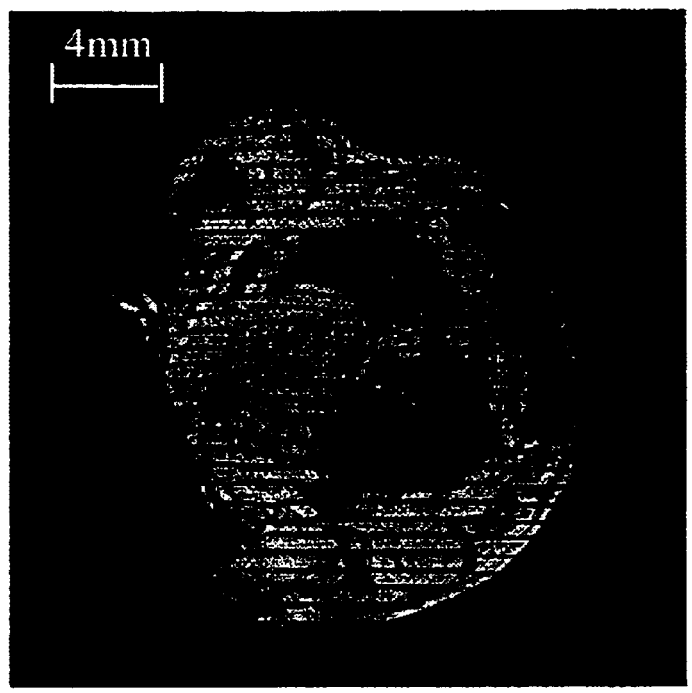
FIG. 11 is an example of an image of a mouse heart acquired with the present invention.
Figure 12:
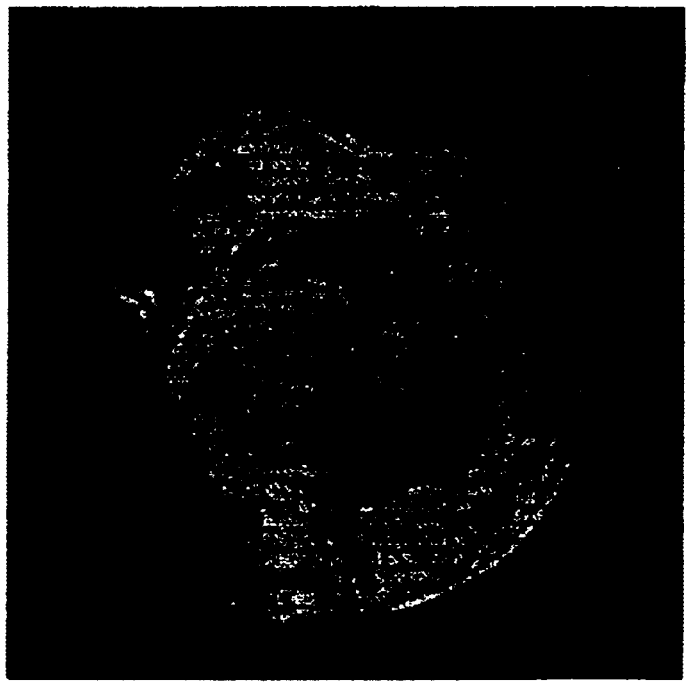
FIG. 12 is an example of an image of a mouse heart acquired with the prior art DANTE technique for tagging the image.

FIGS. 9A, 9B and 9C are images which illustrate the results from the phantom study employing the waveforms of FIGS. 2A, 3A and 4A, respectively. As predicted, tags with sharp edges were obtained with SINC modulated RF pulse trains. FIGS. 9A, 9B and 9C demonstrate the flexibility to alter the ratio of tag width to tag separation, which cannot be easily provided by the DANTE and SPAMM techniques. FIG. 10 is an image acquired using the prior art DANTE method during the phantom study. The improvement of tag contrast over the conventional DANTE tagging technique is apparent. FIGS. 11 and 12 illustrate 1D tagging of a wild-type mouse heart by the SINC modulated RF pulse train of the present invention and the conventional DANTE technique, respectively. The nominal tag width and separation were 0.16 mm and 0.65 mm, respectively. The sharper-edged tagging by the SINC modulated RF train is apparent in the myocardium and the entire field of view of FIG. 9A.

Figure 9D:
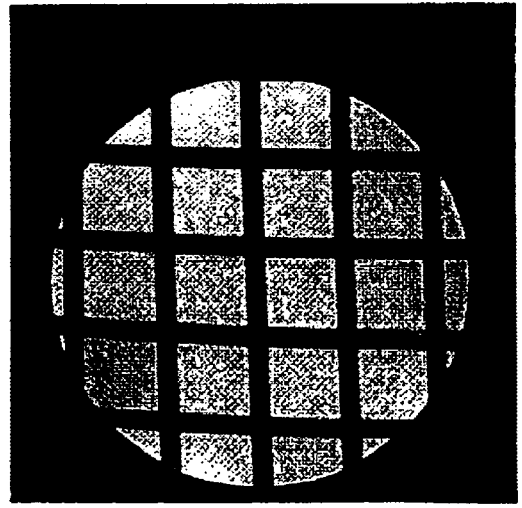
FIG. 9D is an example of an image acquired during a phantom study illustrating an extension of the present invention into two dimensional tag lines.

FIG. 9D illustrates an extension of the present invention into two dimensional tag lines. The tag lines are added in a direction orthogonal to the initial tag lines, thereby forming a grid, by following the same procedure described above for $G_x$ with either the $G_y$ or $G_x$ gradients.

Although the present invention has been described in connection with specific exemplary embodiments, it should be understood that various changes, substitutions and alterations can be made to the disclosed embodiments without departing from the spirit and scope of the invention as set forth in the appended claims.

What is claimed is:

1. A method of inducing tag lines in an MRI image, comprising:
    determining a desired tag line width;
    determining a desired tag line separation;
    selecting a parameter of a SINC modulating function in accordance with the desired tag line width;
    selecting a parameter of an RF pulse train based upon the desired tag line separation, wherein the RF pulses of the RF pulse train are separated by a delay time, and wherein the delay time between pulses of the RF pulse train determines the tag line separation;
    applying a gradient field to the specimen being imaged;
    modulating the RF pulse train in accordance with the SINC modulating function; and
    applying the modulated RF pulse train to the specimen being imaged prior to an image acquisition operation.

2. The method of claim 1, wherein the SINC modulating function is defined at least in part by the bandwidth of a main lobe, and wherein altering the bandwidth of the main lobe alters the width of the resulting tag lines.

3. The method of claim 2, wherein the width of the resulting tag lines is further determined by the magnitude of the applied gradient field.

4. The method of claim 1, wherein the separation of the resulting tag lines is further determined by the magnitude of the applied gradient field.

5. The method of claim 1, wherein each pulse in the RF pulse train has a flip angle associated with a pulse amplitude and pulse duration, and wherein the pulse amplitude and pulse duration are varied in an inverse relationship to maintain the flip angle associated with said pulse.

6. The method of claim 5, wherein the pulses in the RF pulse train have a common amplitude and have a duty cycle modulated in accordance with the SINC function.

7. The method of claim 1, wherein the step of applying the gradient occurs in a pulsed manner such that the gradient is active only between pulses of the RF pulse train.

8. The method of claim 7, wherein the SINC modulating function is defined at least in part by the bandwidth of a main lobe, and wherein altering the bandwidth of the main lobe alters the width of the resulting tag lines.

9. The method of claim 7, wherein the RF pulses of the RF pulse train are separated by a delay time, and wherein the delay time between pulses of the RF pulse train determines the tag line separation.

10. The method of claim 7, wherein each pulse in the RF pulse train has a flip angle associated with a pulse amplitude and pulse duration, and wherein the pulse amplitude and pulse duration are varied in an inverse relationship to maintain the flip angle associated with said pulse.

11. The method of claim 10, wherein the pulses in the RF pulse train have a common amplitude and have a duty cycle modulated in accordance with the SINC function.

12. Computer readable media programmed to control a computer processor of an MRI apparatus to perform a method of inducing tag lines in an MRI image, comprising:
    determining a desired tag line width;
    determining a desired tag line separation;
    selecting a parameter of a SINC modulating function in accordance with the desired tag line width;
    selecting a parameter of an RF pulse train based upon the desired tag line separation, wherein the RF pulses of the RF pulse train are separated by a delay time, and wherein the delay time between pulses of the RF pulse train determines the tag line separation;
    applying a gradient field to the specimen being imaged;
    modulating the RF pulse train in accordance with the SINC modulating function; and
    applying the modulated RF pulse train to the specimen being imaged prior to an image acquisition operation.

13. The computer readable media of claim 12, wherein the SINC modulating function is defined at least in part by the bandwidth of a main lobe, and wherein altering the bandwidth of the main lobe alters the width of the resulting tag lines.

14. The computer readable media of claim 12, wherein each pulse in the RF pulse train has a flip angle associated with a pulse amplitude and pulse duration, and wherein the pulse amplitude and pulse duration are varied in an inverse relationship to maintain the flip angle associated with said pulse.

15. The computer readable media of claim 14, wherein the pulses in the RF pulse train have a common amplitude and have a duty cycle modulated in accordance with the SINC function.

16. The computer readable media of claim 12, wherein the step of applying the gradient occurs in a pulsed manner such that the gradient is active only between pulses of the RF pulse train.

17. The computer readable media of claim 16, wherein the SINC modulating function is defined at least in part by the bandwidth of a main lobe, and wherein altering the bandwidth of the main lobe alters the width of the resulting tag lines.

18. The computer readable media of claim 17, wherein the RF pulses of the RF pulse train are separated by a delay time, and wherein the delay time between pulses of the RF pulse train determines the tag line separation.

19. The computer readable media of claim 16, wherein each pulse in the RF pulse train has a flip angle associated with a pulse amplitude and pulse duration, and wherein the pulse amplitude and pulse duration are varied in an inverse relationship to maintain the flip angle associated with said pulse.

20. The computer readable media of claim 19, wherein the pulses in the RF pulse train have a common amplitude and have a duty cycle modulated in accordance with the SINC function.

* * * * *